United States Patent
Kouda et al.

(10) Patent No.: US 11,921,138 B2
(45) Date of Patent: Mar. 5, 2024

(54) INSULATION RESISTANCE DETECTION DEVICE

(71) Applicant: DENSO CORPORATION, Kariya (JP)

(72) Inventors: Masakazu Kouda, Kariya (JP); Ryota Kubokawa, Kariya (JP); Yusuke Shindo, Kariya (JP); Toru Wakimoto, Nisshin (JP)

(73) Assignee: DENSO CORPORATION, Kariya (JP)

( * ) Notice: Subject to any disclaimer, the term of this patent is extended or adjusted under 35 U.S.C. 154(b) by 306 days.

(21) Appl. No.: 17/340,906

(22) Filed: Jun. 7, 2021

(65) Prior Publication Data

US 2021/0293865 A1 Sep. 23, 2021

Related U.S. Application Data

(63) Continuation of application No. PCT/JP2019/047398, filed on Dec. 4, 2019.

(30) Foreign Application Priority Data

Dec. 7, 2018 (JP) .................................. 2018-229897

(51) Int. Cl.
*G01R 27/02* (2006.01)
*B60L 3/00* (2019.01)
*G01R 27/18* (2006.01)
*G01R 31/52* (2020.01)

(52) U.S. Cl.
CPC .......... *G01R 27/025* (2013.01); *B60L 3/0046* (2013.01); *G01R 27/18* (2013.01); *G01R 31/52* (2020.01)

(58) Field of Classification Search
CPC ...... G01R 27/025; G01R 27/18; G01R 31/52; G01R 31/007; B60L 3/0046; B60L 3/12; B60L 3/0069; B60L 2260/44
See application file for complete search history.

(56) References Cited

U.S. PATENT DOCUMENTS

| 10,175,288 B2 * | 1/2019 | Pritelli | G01R 31/006 |
| 2003/0234653 A1 * | 12/2003 | Kollenda | G01R 31/52 |
| | | | 324/551 |

(Continued)

FOREIGN PATENT DOCUMENTS

JP 2009-300400 A 12/2009

*Primary Examiner* — Patrick Assouad
*Assistant Examiner* — Demetrius R Pretlow
(74) *Attorney, Agent, or Firm* — Oliff PLC (57) ABSTRACT

An insulation resistance detection device detects a voltage at a connection point between a coupling capacitor and a resistance in the case where a frequency signal is outputted to the resistance, and detects an insulation resistance between a ground portion and a power supply path based on a moving average value of a detection voltage. The insulation resistance detection device includes a first determination unit, a resistance detection unit, and a second determination unit. In response to a determination that the pulsation of the detection voltage is attenuated, the resistance detection unit detects the insulation resistance based on, instead of a first moving average value, a second moving average value calculated by using the detection voltage in a second range including a smaller number of detection voltages than in the first range.

9 Claims, 8 Drawing Sheets

(56) References Cited

U.S. PATENT DOCUMENTS

| | | | | |
|---|---|---|---|---|
| 2008/0197855 A1* | 8/2008 | Uchida | ............... | G01R 31/12 |
| | | | | 324/509 |
| 2009/0134881 A1* | 5/2009 | Tachizaki | ............ | B60L 3/0023 |
| | | | | 324/551 |
| 2010/0315096 A1* | 12/2010 | Yamamoto | ............ | G01R 35/00 |
| | | | | 324/691 |
| 2012/0280697 A1* | 11/2012 | Morimoto | ............ | B60L 3/0069 |
| | | | | 324/606 |
| 2016/0377670 A1* | 12/2016 | Tamida | ............... | G01R 31/52 |
| | | | | 324/551 |
| 2019/0077266 A1* | 3/2019 | Albert | ................... | B60L 50/62 |
| 2020/0049769 A1* | 2/2020 | Weinmann | ............ | H02H 7/09 |
| 2020/0158784 A1* | 5/2020 | Fabregas | ................ | B60L 3/04 |

* cited by examiner

INSULATION RESISTANCE DETECTION DEVICE

CROSS-REFERENCE TO RELATED APPLICATION

This application is the U.S. bypass application of International Application No. PCT/JP2019/047398 filed Dec. 4, 2019 which designated the U.S. and claims priority to Japanese Patent Application No. 2018-229897 filed Dec. 7, 2018, the contents of both of which are incorporated herein by reference.

TECHNICAL FIELD

The present disclosure relates to an insulation resistance detection device.

BACKGROUND

Conventionally, for example, in a vehicle, a known insulation resistance detection device determines an electric leakage on the basis of a reduction in insulation resistance between an electrical system and a ground portion mounted on the vehicle (e.g., JP 2009-300400 A). The insulation resistance detection device outputs a predetermined frequency signal to a connection line connected to the electrical system, and detects a voltage (peak value) of the connection line in a predetermined cycle and detects an insulation resistance on the basis of a moving average value of the detection voltage. An insulation resistance detection device of JP 2009-300400 A sets an effective range on the basis of detection voltages detected by the previous cycles, and calculates a moving average value by using the detection voltages in the effective range. Thus, the insulation resistance detection device aims to improve accuracy of insulation resistance detection.

SUMMARY

An aspect of the present disclosure is an insulation resistance detection device for a power supply system including a DC power supply, a coupling capacitor, one end of which is connected to a power supply path connected to the DC power supply and insulated from a ground portion, a resistance that is connected to the other end of the coupling capacitor, and an oscillation unit that is connected to the resistance and outputs a predetermined frequency signal to the resistance.

The insulation resistance detection device detects, in a predetermined cycle, a voltage at a connection point between the coupling capacitor and the resistance in the case where the oscillation unit outputs the frequency signal to the resistance, and detects an insulation resistance between the ground portion and the power supply path based on a moving average value of a detection voltage, the insulation resistance detection device including a first determination unit that determines whether the detection voltage is changed by a predetermined value or more, a resistance detection unit that in response to a determination that the detection voltage is changed by the predetermined value or more, detects the insulation resistance based on a first moving average value calculated by using the detection voltage in a first range, and a second determination unit that after the determination that the detection voltage is changed by the predetermined value or more, determines whether pulsation of the detection voltage is attenuated.

In response to a determination that the pulsation of the detection voltage is attenuated, the resistance detection unit detects the insulation resistance based on, instead of the first moving average value, a second moving average value calculated by using the detection voltage in a second range including a smaller number of detection voltages than in the first range.

BRIEF DESCRIPTION OF THE DRAWINGS

The above features of the present disclosure will be made clearer by the following detailed description, given referring to the appended drawing. In the accompanying drawings.

DETAILED DESCRIPTION OF THE PREFERRED EMBODIMENTS

As in JP 2009-300400 A, calculation of the moving average value requires a plurality of detection voltages; thus, the use of the moving average value to detect the insulation resistance allows the insulation resistance to be accurately detected regardless of noise or the like, but requires along period for convergence of the insulation resistance. For example, when an electric leakage occurs, the detection voltage suddenly changes and pulsates. In the case where the pulsation of the detection voltage causes the moving average value to pulsate, the pulsation of the moving average value cannot be reduced until the pulsation of the detection voltage is attenuated. In the case where a larger number of detection voltages are used to calculate the moving average value in order to reduce the pulsation of the moving average value, a longer period is required for the moving average value to change corresponding to a change in the detection voltage. In either of the cases, a long period is required for stabilization of the moving average value. This causes a problem in which a long period is required for convergence of the insulation resistance and determination of an electric leakage is delayed. A technique allowing the insulation resistance to converge at an early stage and capable of appropriately detecting the insulation resistance is desired.

The present disclosure has been made to solve the above problem, and an object of the present disclosure is to provide an insulation resistance detection device capable of appropriately detecting an insulation resistance.

An aspect of the present disclosure is an insulation resistance detection device for a power supply system including a DC power supply, a coupling capacitor, one end of which is connected to a power supply path connected to the DC power supply and insulated from a ground portion, a resistance that is connected to the other end of the coupling capacitor, and an oscillation unit that is connected to the resistance and outputs a predetermined frequency signal to the resistance.

The insulation resistance detection device detects, in a predetermined cycle, a voltage at a connection point between the coupling capacitor and the resistance in the case where the oscillation unit outputs the frequency signal to the resistance, and detects an insulation resistance between the ground portion and the power supply path based on a moving average value of a detection voltage, the insulation resistance detection device including a first determination unit that determines whether the detection voltage is changed by a predetermined value or more, a resistance detection unit that in response to a determination that the detection voltage is changed by the predetermined value or more, detects the insulation resistance based on a first moving average value calculated by using the detection voltage in a first range, and a second determination unit that after the determination that the detection voltage is changed by the predetermined value or more, determines whether pulsation of the detection voltage is attenuated.

In response to a determination that the pulsation of the detection voltage is attenuated, the resistance detection unit detects the insulation resistance based on, instead of the first moving average value, a second moving average value calculated by using the detection voltage in a second range including a smaller number of detection voltages than in the first range.

Since the moving average value is used to detect the insulation resistance, the insulation resistance can be accurately detected regardless of noise or the like. Furthermore, when an electric leakage occurs between the ground portion and the power supply path, the detection voltage changes by the predetermined value or more and pulsates. Thus, in response to the determination that the detection voltage is changed by the predetermined value or more, the first moving average value is calculated by using a relatively large number of detection voltages, and the insulation resistance is detected on the basis of the first moving average value. This makes it possible to reduce pulsation of the first moving average value due to the pulsation of the detection voltage. Furthermore, in response to the determination that the detection voltage is changed by the predetermined value or more and the subsequent determination that the pulsation of the detection voltage is attenuated, instead of the first moving average value, the second moving average value is calculated by using a relatively small number of detection voltages, and the insulation resistance is detected on the basis of the second moving average value. This enables the second moving average value to be stabilized at an early stage at the voltage after the occurrence of an electric leakage. As a result, even when an electric leakage occurs, it is possible to allow the insulation resistance to converge at an early stage, enabling the insulation resistance to be appropriately detected.

First Embodiment

A first embodiment which is an embodiment of an insulation resistance detection device according to the present disclosure will be described below with reference to the drawings. An insulation resistance detection device 50 of the present embodiment is mounted on an electric vehicle including a rotary electric machine, for example, on a hybrid vehicle.

Figure 1:
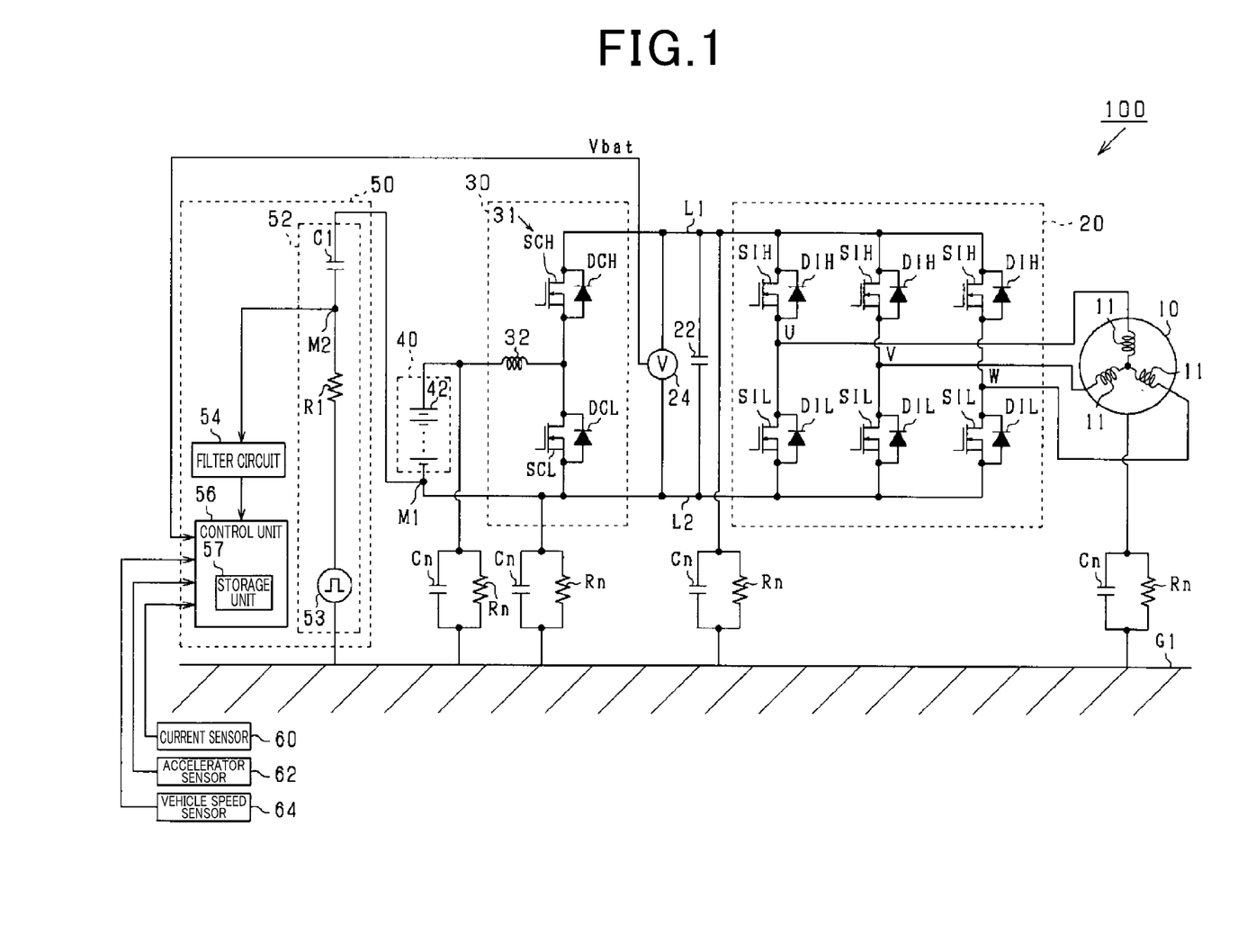
FIG. 1 is an overall configuration diagram of a vehicle power supply system.

As shown in FIG. 1, a vehicle power supply system 100 of the present embodiment includes a rotary electric machine 10, an inverter 20, a converter 30, a DC power supply 40, and an insulation resistance detection device 50. In the present embodiment, the rotary electric machine 10 is a motor including star-connected three-phase windings 11. A rotor of the rotary electric machine 10 is connected to a driving wheel of the vehicle so that power can be transmitted. The rotary electric machine 10 is, for example, a synchronous machine.

The rotary electric machine 10 is connected to the DC power supply 40 via the inverter 20 and the converter 30. In the present embodiment, the DC power supply 40 is a chargeable and dischargeable storage battery, and is composed of a plurality of battery cells 42 that are serially connected. The battery cell may be, for example, a lithium-ion storage battery or a nickel-hydrogen storage battery.

The inverter 20 includes a serial connection of an upper-arm switch SIH and a lower-arm switch SIL for each of a U-phase, a V-phase, and a W-phase. In the present embodiment, the switches SIH and SIL are each an N-channel MOSFET that is a unipolar element and is made of SiC. The upper-arm switch SIH includes an upper-arm diode DIH as a body diode, and the lower-arm switch SIL includes a lower-arm diode DIL as a body diode.

The inverter 20 is connected to the rotary electric machine 10 and the converter 30. Specifically, in each phase, a connection point between a source of the upper-arm switch SIH and a drain of the lower-arm switch SIL is connected to a first end of the winding 11 of the rotary electric machine 10. Second ends of the windings 11 of the phases are connected at a neutral point.

The converter 30 is a boost DC-DC converter that boosts a power supply voltage Vbat of the DC power supply 40 and outputs the power supply voltage Vbat to the inverter 20. The converter 30 includes a serial connection 31 of an upper-arm transformation switch SCH and a lower-arm transformation switch SCL, and a smoothing reactor 32. In the present embodiment, the transformation switches SCH and SCL are each an N-channel MOSFET that is a unipolar element and is made of SiC. The upper-arm transformation switch SCH includes an upper-arm transformation diode DCH as a body diode, and the lower-arm transformation switch SCL includes a lower-arm transformation diode DCL as a body diode.

A drain of the upper-arm transformation switch SCH is connected to a drain of the upper-arm switch SIH of each phase of the inverter 20. A connection point between a source of the upper-arm transformation switch SCH and a drain of the lower-arm transformation switch SCL is connected to a first end of the smoothing reactor 32. A second end of the smoothing reactor 32 is connected to a positive electrode terminal of the DC power supply 40. A source of the lower-arm transformation switch SCL is connected to a negative electrode terminal of the DC power supply 40 and a source of the lower-arm switch SIL of each phase of the inverter 20.

The vehicle power supply system 100 includes a smoothing capacitor 22 and a power supply voltage detection unit 24. The smoothing capacitor 22 is arranged between the drain of the upper-arm transformation switch SCH and the source of the lower-arm transformation switch SCL of the converter 30. The power supply voltage detection unit 24 detects a terminal voltage of the smoothing capacitor 22 as the power supply voltage Vbat.

A positive-electrode-side power supply path L1 connected to the positive electrode terminal of the DC power supply 40 is connected to a positive-electrode-side terminal of an electrical load such as the converter 30 (e.g., the drain of the upper-arm transformation switch SCH). Similarly, a negative-electrode-side power supply path L2 connected to the negative electrode terminal of the DC power supply 40 is connected to a negative-electrode-side terminal of the electrical load such as the converter 30 (e.g., the source of the lower-arm transformation switch SCL).

The positive-electrode-side power supply path L1 and the negative-electrode-side power supply path L2 are electrically insulated from a ground portion G1 such as a vehicle body. A resistance between each of the power supply paths L1 and L2 and the ground portion G1 can be referred to as an insulation resistance Rn. Furthermore, ground capacitances such as a capacitance of a capacitor for noise removal and a stray capacitance are present between each of the power supply paths L1 and L2 and the ground portion G1, and these capacitances are collectively referred to as an insulation capacitance Cn.

The rotary electric machine 10 is electrically connected to the power supply paths L1 and L2. Thus, a resistance between the rotary electric machine 10 and the ground portion G1 is also referred to as the insulation resistance Rn, and a capacitance between the rotary electric machine 10 and the ground portion G1 is also referred to as the insulation capacitance Cn.

The insulation resistance detection device 50 is connected to one of the positive-electrode-side power supply path L1 and the negative-electrode-side power supply path L2, and detects the insulation resistance Rn between the ground portion G1 and the one of the power supply paths L1 and L2. The insulation resistance detection device 50 will be described below.

The insulation resistance detection device 50 includes a circuit unit 52, a filter circuit 54, and a control unit 56. The circuit unit 52 includes an oscillation unit 53 that outputs an AC signal having a predetermined frequency, a resistance R1, and a coupling capacitor C1. The oscillation unit 53, the resistance R1, and the coupling capacitor C1 are serially connected in this order, and a first end of the oscillation unit 53 is connected to the coupling capacitor C1 via the resistance R1. A second end of the oscillation unit 53 is connected to the ground portion G1.

The coupling capacitor C1 is connected to a connection point M1 of the negative-electrode-side power supply path L2. The coupling capacitor C1 blocks a DC component of the input and allows an AC component of the input to pass through between the insulation resistance detection device 50 which is a low-voltage circuit and each of the DC power supply 40, the converter 30, the inverter 20, and the rotary electric machine 10 which are a high-voltage circuit.

In the circuit unit 52, in the case where the oscillation unit 53 outputs an AC signal via the resistance R1 and the coupling capacitor C1, a voltage at a connection point M2 has, in the end, a value obtained by dividing the AC signal outputted from the oscillation unit 53 by a resistance value of the resistance R1 and a resistance value of the insulation resistance Rn. The voltage, which is a detection voltage VD, is inputted to the filter circuit 54. In the present embodiment, the AC signal corresponds to a "frequency signal".

The filter circuit 54 is connected to the connection point M2 between the resistance R1 and the coupling capacitor C1. The filter circuit 54 is an A/D conversion circuit that converts a voltage (analog signal) at the connection point M2 in the case where the oscillation unit 53 outputs an AC voltage to the resistance R1 into a digital signal suitable for a process performed by the control unit 56, and outputs the digital signal.

The control unit 56 detects the voltage at the connection point M2 via the filter circuit 54 in a predetermined cycle, and detects the insulation resistance Rn between the ground portion G1 and each of the power supply paths L1 and L2 on the basis of a moving average value VA of the detection voltage VD. The predetermined cycle is equal to a cycle of the AC voltage, and is substantially 2 Hz. The control unit 56 uses the detected insulation resistance Rn to determine an insulation state of the high-voltage circuit, that is, the presence or absence of an electric leakage.

In response to a determination that an electric leakage has occurred, the control unit 56 performs various processes corresponding to the electric leakage. For example, the control unit 56 outputs an alarm. The function provided by the control unit 56 may be provided, for example, by software recorded in a tangible memory device, a computer or hardware executing the software, or a combination thereof.

Output signals from various sensors are inputted to the control unit 56. For example, a current sensor 60 that detects a charge-discharge current of the DC power supply 40 acquires a power supply amount PW of the DC power supply 40. The power supply amount PW is, for example, an amount of power supplied from the DC power supply 40 to the rotary electric machine 10, an air-conditioning system (not shown), or the like. Furthermore, an accelerator sensor 62 acquires an amount of accelerator operation due to accelerator operation (operation of an accelerator pedal), and a vehicle speed sensor 64 acquires a vehicle speed YM.

Calculation of the moving average value VA requires a plurality of detection voltages VD; thus, the use of the moving average value VA to detect the insulation resistance Rn allows the insulation resistance Rn to be accurately detected regardless of noise or the like, but requires a long period for convergence of the insulation resistance Rn. For example, when an electric leakage occurs, the detection voltage VD suddenly changes and pulsates. In the case where the pulsation of the detection voltage VD causes the moving average value VA to pulsate, the pulsation of the moving average value VA cannot be reduced until the pulsation of the detection voltage VD is attenuated. In the case where a larger number of detection voltages VD are used to calculate the moving average value VA in order to reduce the pulsation of the moving average value VA, a longer period is required for the moving average value VA to change corresponding to a change in the detection voltage VD. In either of the cases, a long period is required for stabilization of the moving average value VA. This causes a problem in which a long period is required for convergence of the insulation resistance Rn and determination of an electric leakage is delayed. A technique allowing the insulation resistance Rn to converge at an early stage and capable of appropriately detecting the insulation resistance Rn is desired.

The insulation resistance detection device 50 of the present embodiment performs an insulation resistance detection process as follows. That is, in response to a determination that the detection voltage VD is changed by a predetermined value or more, a first moving average value VA1 is calculated by using a relatively large number of detection voltages VD, and the insulation resistance Rn is detected on the basis of the first moving average value VA1. Furthermore, in response to the determination that the detection voltage VD is changed by the predetermined value or more and a subsequent determination that the pulsation of the detection voltage VD is attenuated, instead of the first moving average value VA1, a second moving average value VA2 is calculated by using a relatively small number of detection voltages VD, and the insulation resistance Rn is detected on the basis of the second moving average value VA2. Thus, as compared with the case where the insulation resistance Rn is detected only on the basis of the first moving average value VA1 or only on the basis of the second moving average value VA2, it is possible to allow the insulation resistance Rn to converge at an early stage, enabling the insulation resistance Rn to be appropriately detected.

Figure 2:
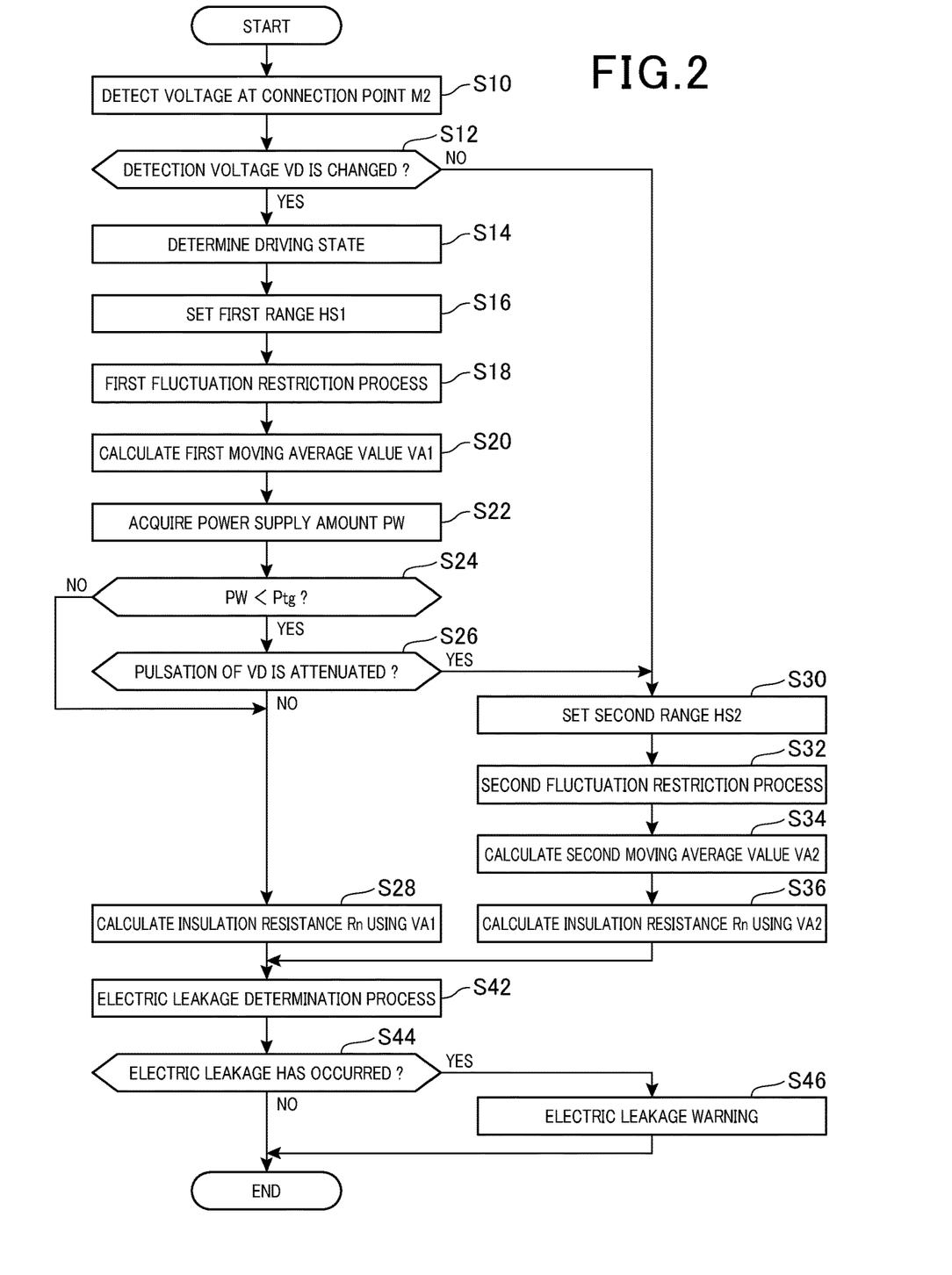
FIG. 2 is a flow chart of an insulation resistance detection process according to a first embodiment.

FIG. 2 shows a flow chart of the insulation resistance detection process of the present embodiment. The control unit 56 repeatedly performs the insulation resistance detection process in a predetermined cycle while the vehicle power supply system 100 is driven, that is, while an ignition switch of the vehicle equipped with the insulation resistance detection device 50 is ON.

When the insulation resistance detection process is started, first, in step S10, a voltage at the connection point M2 is detected. In subsequent step S12, it is determined whether the detection voltage VD detected in step S10 is changed by a first predetermined value Vtg1 or more from the detection voltage VD detected in the previous cycle. The first predetermined value Vtg1 is a value corresponding to a voltage difference between an insulation voltage VF and a short-circuit voltage VN (see FIG. 3). The insulation voltage VF is a voltage at the connection point M2 in a situation where no short circuit has occurred between the ground portion G1 and the power supply path L1 or L2, that is, a situation where no electric leakage has occurred. The short-circuit voltage VN is a voltage at the connection point M2 in a situation where a short circuit has occurred between the ground portion G1 and the power supply path L1 or L2, that is, a situation where an electric leakage has occurred. In the present embodiment, the first predetermined value Vtg1 corresponds to a "predetermined value", and the process in step S12 corresponds to a "first determination unit".

If an affirmative determination is made in step S12, in step S14, the amount of accelerator operation is acquired on the basis of an output signal from the accelerator sensor 62, and a driving state of the rotary electric machine 10 is determined. As described above, the rotor of the rotary electric machine 10 is connected to the driving wheel of the vehicle, and the vehicle travels by driving of the rotary electric machine 10. Thus, the driving state of the rotary electric machine 10 can be considered to indicate a traveling state of the vehicle, and for example, an acceleration state in which a rotation speed of the rotary electric machine 10 is increased corresponds to a vehicle acceleration state of the vehicle. Furthermore, a deceleration state in which the rotation speed of the rotary electric machine 10 is reduced corresponds to a vehicle deceleration state of the vehicle. In the present embodiment, the process in step S14 corresponds to a "driving determination unit".

In subsequent step S16, a range HS of the detection voltage VD used to calculate the moving average value VA is set. The range HS is defined by an effective voltage range HV and an acquisition period HT of the detection voltage VD. The effective voltage range HV is a voltage range in which the detection voltage VD is acquired, and the acquisition period HT is a period in which the detection voltage VD is acquired. The moving average value VA is calculated by using the detection voltages VD in the effective voltage range HV and in the acquisition period HT, and the detection voltages VD outside the effective voltage range HV or outside the acquisition period HT are not used to calculate the moving average value VA (see x marks in FIG. 3).

In the present embodiment, of the effective voltage range HV and the acquisition period HT, the effective voltage range HV is set to a fixed voltage range determined in advance on the basis of the first predetermined value Vtg1. Thus, in step S16, only the acquisition period HT is set, and specifically, a first acquisition period HT1 (see FIG. 3) is set on the basis of the driving state of the rotary electric machine 10 determined in step S14. Accordingly, a first range HS1 used to calculate the first moving average value VA1 is set. In the present embodiment, the process in step S16 corresponds to a "setting unit".

In subsequent steps S18 and S20, the first moving average value VA1 is calculated by using the first range HS1 set in step S16. Specifically, in step S18, a first fluctuation restriction process is performed. The first fluctuation restriction process is a process in which during a reduction in noise or the like in the detection voltage VD by using the moving average, the effective voltage range HV is set for the detection voltage VD in the first acquisition period HT1 to reduce the influence of the change in the power supply voltage Vbat. In the present embodiment, an upper limit value HU and a lower limit value HD of the effective voltage range HV are set on the basis of the detection voltages VD detected by the previous cycle. In subsequent step S20, the first moving average value VA1 is calculated. The first moving average value VA1 is an average value of the detection voltages VD detected by the first acquisition period HT1 before the current time.

In step S22, the power supply amount PW of the DC power supply 40 is acquired on the basis of an output signal from the current sensor 60. In subsequent step S24, it is determined whether the power supply amount PW acquired in step S22 is smaller than a predetermined amount Ptg. The predetermined amount Ptg is the power supply amount PW that causes, in the power supply voltage Vbat, noise equal to or greater than a second predetermined value Vtg2 (see FIG. 3) which is smaller than the first predetermined value Vtg1. In the present embodiment, the process in step S22 corresponds to an "information acquisition unit".

If an affirmative determination is made in step S24, in step S26, it is determined whether the pulsation of the detection voltage VD is attenuated. That is, after the determination in step S12 that the detection voltage VD is changed by the first predetermined value Vtg1 or more, it is determined whether the pulsation of the detection voltage VD is attenuated. Specifically, it is determined whether a change amount ΔV of the first moving average value VA1 is smaller than the second predetermined value Vtg2. In the present embodiment, the process in step S26 corresponds to a "second determination unit".

If a negative determination is made in step S26, in step S28, the insulation resistance Rn is detected on the basis of the first moving average value VA1. That is, in response to the determination that the detection voltage VD is changed by the first predetermined value Vtg1 or more and the determination that the pulsation of the detection voltage VD is not attenuated, the insulation resistance Rn is detected on the basis of the first moving average value VA1 calculated by using the detection voltages VD in the first range HS1. The control unit 56 detects the insulation resistance Rn from the first moving average value VA1 by using conversion information stored in a storage unit 57 (see FIG. 1) of the control unit 56. The storage unit 57 is composed of, for example, a ROM, a rewritable nonvolatile memory, or the like.

If a negative determination is made in step S24, the determination in step S26 is not performed, and in step S28, the insulation resistance Rn is detected on the basis of the first moving average value VA1. That is, on condition that the power supply amount PW of the DC power supply 40 is smaller than the predetermined amount Ptg, it is determined in step S26 whether the pulsation of the detection voltage VD is attenuated.

On the other hand, if a negative determination is made in step S12 or if an affirmative determination is made in step S26, in step S30, a second range HS2 of the detection voltage VD used to calculate the second moving average value VA2 is set. Specifically, the effective voltage range HV for the second range HS2 is determined in advance, and a second acquisition period HT2 for the second range HS2 (see FIG. 3) is set. In the present embodiment, the second acquisition period HT2 is set to be shorter than the first acquisition period HT1. Thus, the second range HS2 is smaller than the first range HS1, and includes a smaller number of detection voltages VD than the first range HS1 does.

In subsequent steps S32 and S34, the second moving average value VA2 is calculated by using the second range HS2 set in step S30. Specifically, in step S32, a second fluctuation restriction process is performed. The second fluctuation restriction process performed in step S32 differs from the first fluctuation restriction process performed in step S18 in that the effective voltage range HV is set for the detection voltage VD in the second acquisition period HT2. In subsequent step S34, the second moving average value VA2 is calculated. The second moving average value VA2 is an average value of the detection voltages VD detected by the second acquisition period HT2 before the current time.

In step S36, the insulation resistance Rn is detected on the basis of the second moving average value VA2. That is, in response to the determination that the pulsation of the detection voltage VD is attenuated, the insulation resistance Rn is detected on the basis of, instead of the first moving average value VA1, the second moving average value VA2 calculated by using the detection voltages VD in the second range HS2. In the present embodiment, the processes in steps S28 and 36 correspond to a "resistance detection unit".

In subsequent step S42, an electric leakage determination process is performed by using the insulation resistance Rn detected in step S28 or S36. In the electric leakage determination process, the presence or absence of an electric leakage is determined, for example, by comparing the insulation resistance Rn detected in step S28 or S36 with a reference value. Alternatively, the presence or absence of an electric leakage is determined, for example, on the basis of a ratio between the insulation resistance Rn detected in step S28 or S36 and the power supply voltage Vbat. In subsequent step S44, on the basis of a result of the process in step S42, it is determined whether an electric leakage has occurred.

If a negative determination is made in step S42, the insulation resistance detection process is ended. On the other hand, if an affirmative determination is made in step S44, in step S46, a warning about the occurrence of an electric leakage is outputted, and the insulation resistance detection process is ended. Together with the output of the warning about the occurrence of an electric leakage, the control unit 56 may perform, for example, a process of stopping power supply or charging from the DC power supply 40 to interrupt energization of the high-voltage circuit and the DC power supply 40. Specifically, the control unit 56 may perform, for example, a process of outputting a driving signal corresponding to the upper-arm transformation switch SCH and a driving signal corresponding to the lower-arm transformation switch SCL to the upper-arm transformation switch SCH and the lower-arm transformation switch SCL, respectively, to interrupt energization of the high-voltage circuit and the DC power supply 40.

Figure 3:
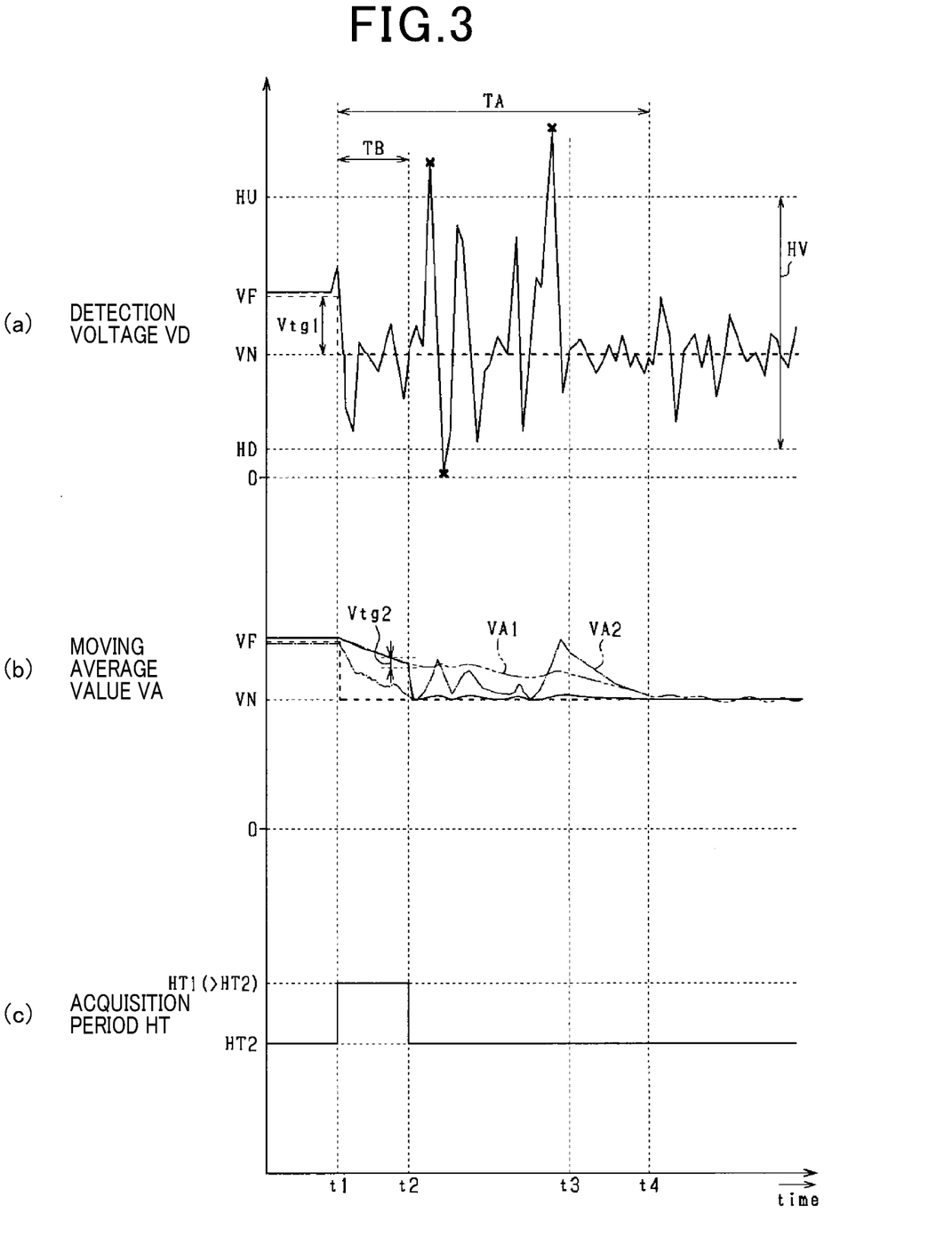
FIG. 3 is a time chart showing transition of a detection voltage and a moving average value according to the first embodiment.

Next, FIG. 3 shows an example of the insulation resistance detection process. FIG. 3 shows transition of the detection voltage VD and the moving average value VA when an electric leakage occurs. FIG. 3 (a) shows transition of the detection voltage VD, FIG. 3 (b) shows transition of the moving average value VA, and FIG. 3 (c) shows transition of the acquisition period HT. In FIG. 3 (b), the solid line indicates the moving average value VA of the present embodiment in which the first moving average value VA1 and the second moving average value VA2 are used in combination, the double-dot-dashed line indicates the moving average value VA of a comparative example in which only the first moving average value VA1 is used, and the dot-dashed line indicates the moving average value VA of the comparative example in which only the second moving average value VA2 is used. For the moving average value VA of the comparative example, the effective voltage range HV is not set, and the moving average value VA is calculated by using all the detection voltages VD in the first acquisition period HT1 and the second acquisition period HT2.

As described above, the second range HS2 includes a smaller number of detection voltages VD than the first range HS1 does. Thus, the second moving average value VA2 calculated by using the second range HS2 has characteristics with good responsiveness but a lack of stability and a high tendency of pulsation, as compared with the first moving average value VA1 calculated by using the first range HS1.

As shown in FIG. 3, when an electric leakage occurs at time t1, the detection voltage VD changes from the insulation voltage VF to the short-circuit voltage VN and pulsates. Thus, in the case where the second moving average value VA2 is calculated as the moving average value VA at the occurrence of an electric leakage, the moving average value VA pulsates due to the pulsation of the detection voltage VD. As a result, the moving average value VA cannot be stabilized until time t4 which is the time after a certain period from time t3 at which the pulsation of the detection voltage VD or the like ends.

It is conceivable that the first moving average value VA1 is calculated as the moving average value VA to reduce the pulsation of the moving average value VA. However, the first moving average value VA1 has characteristics with good stability but a lack of responsiveness and a long time required for change, as compared with the second moving average value VA2. Thus, a long period is required for the moving average value VA to change from the insulation voltage VF to the short-circuit voltage VN, and the moving average value VA cannot be stabilized until time t4. That is, in the case where only the first moving average value VA1 is used as the moving average value VA and in the case where only the second moving average value VA2 is used as the moving average value VA, a transition period TA from time t1 to time t4 is required for the moving average value VA to be stabilized at the short-circuit voltage VN after the occurrence of an electric leakage, leading to a long period required for convergence of the insulation resistance Rn.

In the present embodiment, in response to a determination at time t1 that the detection voltage VD is changed by the first predetermined value Vtg1 or more, the first moving average value VA1 is calculated by using a relatively large number of detection voltages VD, and the insulation resistance Rn is detected on the basis of the first moving average value VAL. Since the first moving average value VA1 has good stability, the pulsation of the first moving average value VA1 due to the pulsation of the detection voltage VD can be suitably reduced. Furthermore, in response to a determination at time t2 after time t1 that the pulsation of the detection voltage VD is attenuated, instead of the first moving average value VA1, the second moving average value VA2 is calculated by using a relatively small number of detection voltages VD, and the insulation resistance Rn is detected on the basis of the second moving average value VA2. Since the second moving average value VA2 has good responsiveness, the moving average value VA can be stabilized immediately after time t2 at the short-circuit voltage VN after the occurrence of an electric leakage. As a result, when an electric leakage occurs, the period required for convergence of the insulation resistance Rn can be reduced to a determination period TB from time t1 to time t2, enabling the insulation resistance Rn to be appropriately detected.

As shown in FIG. 3, during a period until time t3 after the pulsation of the detection voltage VD is attenuated, the detection voltage VD is changed due to the traveling state of the vehicle or the like. As indicated by the double-dot-dashed line in FIG. 3, in the case of the second moving average value VA2 for which the effective voltage range HV is not set, the moving average value VA is changed due to the traveling state of the vehicle or the like, and the insulation resistance Rn cannot be appropriately detected.

In the present embodiment, the effective voltage range HV defined on the basis of the first predetermined value Vtg1 is set for the second range HS2 used to calculate the second moving average value VA2, and the effective voltage range HV is subjected to the second fluctuation restriction process. This enables the second moving average value VA2 to be calculated by using the detection voltages VD in the effective voltage range HV appropriately set. As a result, it is possible to reduce the change in the second moving average value VA2 due to the traveling state of the vehicle or the like, enabling the insulation resistance Rn to be appropriately detected.

Figure 4:
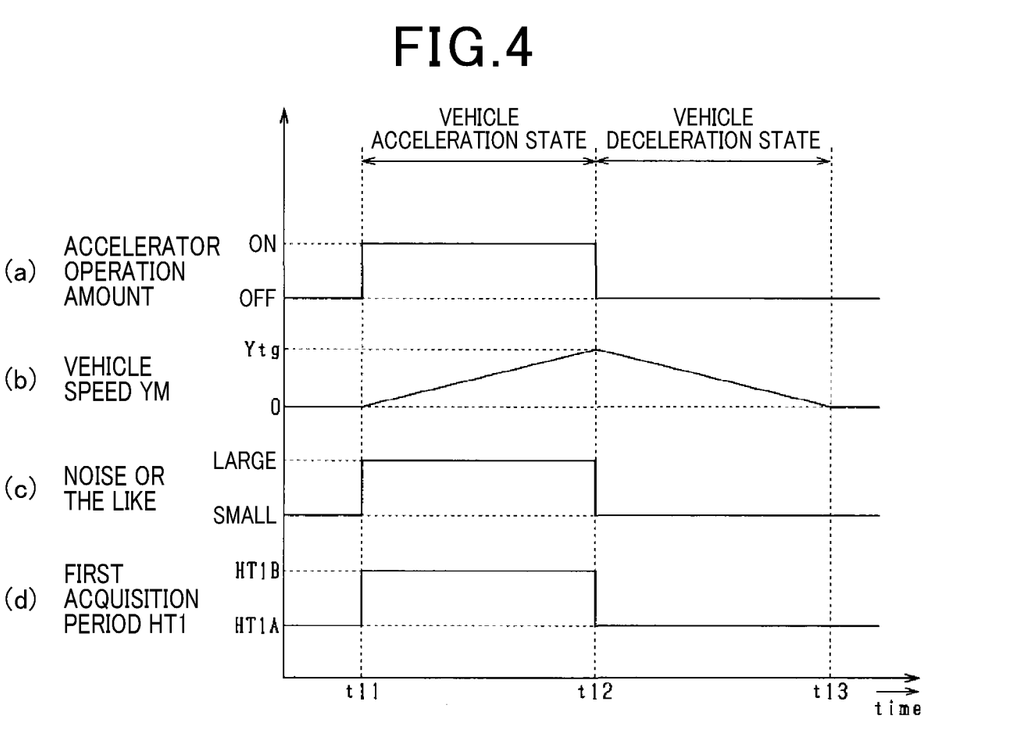
FIG. 4 is a time chart showing transition of a first acquisition period.

FIG. 4 shows an example of a method of setting the first range HS1. FIG. 4 shows transition of the first acquisition period HT1. FIG. 4 (a) shows transition of the accelerator operation, FIG. 4 (b) shows transition of the vehicle speed YM, FIG. 4 (c) shows transition of the noise or the like generated in the power supply voltage Vbat due to the accelerator operation, and FIG. 4 (d) shows transition of the first acquisition period HT1. In FIG. 4 (a), an "ON" state indicates a state in which an accelerator operation is performed, and an "OFF" state indicates a state in which no accelerator operation is performed.

As shown in FIG. 4, when at time t11, the accelerator operation is switched from the OFF state to the ON state, and the state of the vehicle is switched from a vehicle stop state to the vehicle acceleration state, the vehicle speed YM is increased from zero. Due to the switching of the accelerator operation to the ON state, for example, boosting operation of the converter 30 for boosting the power supply voltage Vbat is performed, leading to an increase in the noise or the like generated in the power supply voltage Vbat. In the present embodiment, in response to a determination that the state of the vehicle is the vehicle acceleration state on the basis of the output signal from the accelerator sensor 62, the first acquisition period HT1 is set to a long-side acquisition period HT1B which is relatively long.

When the vehicle speed YM reaches a threshold speed Ytg at time t12, the accelerator operation is switched from the ON state to the OFF state, and the state of the vehicle is switched from the vehicle acceleration state to the vehicle deceleration state. The vehicle deceleration state continues until time t13, and at time t13, the vehicle deceleration state is switched to the vehicle stop state. Due to the switching of the accelerator operation to the OFF state, the boosting operation of the converter 30 or the like is stopped, leading to a reduction in the noise or the like generated in the power supply voltage Vbat. In the present embodiment, in response to a determination that the state of the vehicle is the vehicle deceleration state on the basis of the output signal from the accelerator sensor 62, the first acquisition period HT1 is set to a short-side acquisition period HT1A which is relatively short.

That is, in the present embodiment, in the case where it is determined that the state of the vehicle is the vehicle acceleration state, the first acquisition period HT1 is set to be longer and accordingly the first range HS1 is set to be larger than in the case where it is determined that the state of the vehicle is the vehicle deceleration state. By setting the first range HS1 according to the magnitude of the noise or the like generated due to the traveling state of the vehicle, the influence of the noise or the like on the first moving average value VA1 can be reduced, enabling the insulation resistance Rn to be appropriately detected.

The present embodiment described above achieves the following effects.

In the present embodiment, since the moving average value VA is used to detect the insulation resistance Rn, the insulation resistance Rn can be accurately detected regardless of noise or the like. Furthermore, when an electric leakage occurs between the ground portion G1 and the power supply path L1 or L2, the detection voltage VD changes by the first predetermined value Vtg1 or more and pulsates. Thus, in response to the determination that the detection voltage VD is changed by the first predetermined value Vtg1 or more, the first moving average value VA1 is calculated by using a relatively large number of detection voltages VD, and the insulation resistance Rn is detected on the basis of the first moving average value VAL. This makes it possible to reduce the pulsation of the first moving average value VA1 due to the pulsation of the detection voltage VD. Furthermore, in response to the determination that the detection voltage VD is changed by the first predetermined value Vtg1 or more and the subsequent determination that the pulsation of the detection voltage VD is attenuated, instead of the first moving average value VA1, the second moving average value VA2 is calculated by using a relatively small number of detection voltages VD, and the insulation resistance Rn is detected on the basis of the second moving average value VA2. This enables the second moving average value VA2 to be stabilized at an early stage at the short-circuit voltage VN after the occurrence of an electric leakage. As a result, even when an electric leakage occurs, it is possible to allow the insulation resistance Rn to converge at an early stage, enabling the insulation resistance Rn to be appropriately detected.

In particular, in the present embodiment, the first moving average value VA1 is used to determine whether the pulsation of the detection voltage VD is attenuated. This makes it possible to accurately determine, by using the first moving average value VA1 having good stability, that the pulsation of the detection voltage VD is attenuated.

As the acquisition period HT of the detection voltage VD used to calculate the moving average value VA becomes longer, the range HS of the detection voltage VD used to calculate the moving average value VA becomes larger, and a larger number of detection voltages VD are used to calculate the moving average value VA. In the present embodiment, the second acquisition period HT2 used to calculate the second moving average value VA2 is set to be shorter than the first acquisition period HT1 used to calculate the first moving average value VAL. This makes it possible to reduce the influence of the pulsation of the detection voltage VD by using the first moving average value VA1 and allow the insulation resistance Rn to converge at an early stage by using the second moving average value VA2.

In the vehicle power supply system 100, noise or the like is generated in the power supply voltage Vbat due to the driving state of the rotary electric machine 10, that is, the traveling state of the vehicle. In the present embodiment, the first acquisition period HT1 is set on the basis of the traveling state of the vehicle, and the first range HS1 is set accordingly. This makes it possible to reduce the influence of the noise or the like generated due to the traveling state of the vehicle, enabling the insulation resistance Rn to be appropriately detected.

Specifically, in the vehicle acceleration state, the boosting operation of the converter 30 or the like is performed due to the accelerator operation; thus, noise or the like is more likely to be generated in the power supply voltage Vbat, and in the vehicle deceleration state, the boosting operation of the converter 30 or the like is stopped; thus, noise or the like is less likely to be generated. In the present embodiment, in the case where it is determined that the state of the vehicle is the vehicle acceleration state, the first acquisition period HT1 is set to be longer and the first range HS1 is set to be larger than in the case where it is determined that the state of the vehicle is the vehicle deceleration state. This makes it possible to suitably reduce the influence of the noise or the like.

In the DC power supply 40, as the power supply amount PW of the DC power supply 40 is larger, that is, as a larger amount of power is supplied from the DC power supply 40 to the rotary electric machine 10 or the air-conditioning system, larger noise or the like is generated in the power supply voltage Vbat. As a result, the first moving average value VA1 is changed. Thus, even in the case where the pulsation of the detection voltage VD is attenuated and the pulsation of the first moving average value VA1 is attenuated accordingly, if the first moving average value VA1 is changed due to the power supply amount PW, it is impossible to appropriately determine that the pulsation of the detection voltage VD is attenuated. In the present embodiment, on condition that the power supply amount PW of the DC power supply 40 is smaller than the predetermined amount Ptg, it is determined whether the pulsation of the detection voltage VD is attenuated. Since attenuation of the pulsation of the detection voltage VD is determined while the power supply amount PW of the DC power supply 40 is smaller than the predetermined amount Ptg and the first moving average value VA1 is not greatly changed, it is possible to appropriately determine that the pulsation of the detection voltage VD is attenuated.

Second Embodiment

With regard to a second embodiment, differences from the first embodiment will be mainly described below with reference to FIG. 5. The present embodiment differs from the first embodiment in that, of the effective voltage range HV and the acquisition period HT that define the range HS, the acquisition period HT is set to a fixed period determined in advance and the effective voltage range HV can be set.

In the present embodiment, a first effective voltage range HV1 (see FIG. 5) is set on the basis of the driving state of the rotary electric machine 10, and the first range HS1 used to calculate the first moving average value VA1 is set accordingly. Furthermore, a second effective voltage range HV2 (see FIG. 5) used to calculate the second moving average value VA2 is set to be smaller than the first effective voltage range HV1. Thus, the second range HS2 is smaller than the first range HS1, and includes a smaller number of detection voltages VD than the first range HS1 does.

Figure 5:
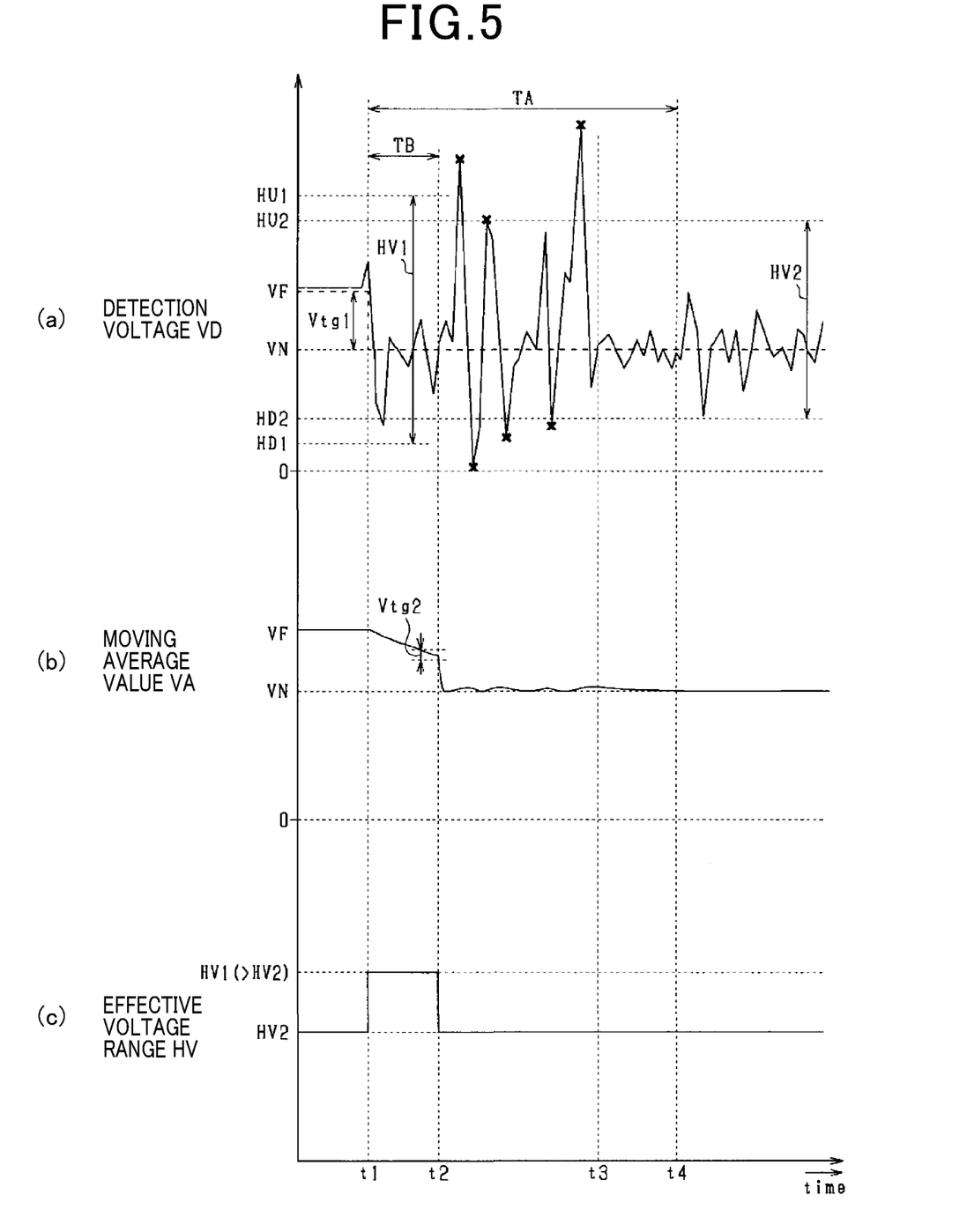
FIG. 5 is a time chart showing transition of the detection voltage and the moving average value according to a second embodiment.

FIG. 5 shows an example of the insulation resistance detection process of the present embodiment. In FIG. 5, for convenience, the same contents as those in FIG. 3 above are denoted by the same reference numerals, and the description thereof is omitted.

In the present embodiment, in response to a determination at time t1 that the detection voltage VD is changed by the first predetermined value Vtg1 or more, a first upper limit value HU1 and a first lower limit value HD1 of the first effective voltage range HV1 are set. Then, the first moving average value VA1 is calculated by using the detection voltages VD in the first effective voltage range HV1, and the insulation resistance Rn is detected on the basis of the first moving average value VA1. Since the first moving average value VA1 has good stability, the pulsation of the first moving average value VA1 due to the pulsation of the detection voltage VD can be suitably reduced.

Furthermore, in response to a determination at time t2 after time t1 that the pulsation of the detection voltage VD is attenuated, a second upper limit value HU2 and a second lower limit value HD2 of the second effective voltage range HV2 are set. Then, the second moving average value VA2 is calculated by using the detection voltages VD in the second effective voltage range HV2, and the insulation resistance Rn is detected on the basis of the second moving average value VA2. Since the second moving average value VA2 has good responsiveness, the moving average value VA can be stabilized immediately after time t2 at the short-circuit voltage VN after the occurrence of an electric leakage. As a result, when an electric leakage occurs, the period required for convergence of the insulation resistance Rn can be reduced, enabling the insulation resistance Rn to be appropriately detected.

In the present embodiment described above, in response to the determination that the detection voltage VD is changed by the first predetermined value Vtg1 or more, the first moving average value VA1 is calculated by using the detection voltages VD in the first effective voltage range HV1, and the insulation resistance Rn is detected on the basis of the first moving average value VA1. Furthermore, in response to the determination that the pulsation of the detection voltage VD is attenuated, the second moving average value VA2 is calculated by using the detection voltages VD in the second effective voltage range HV2, and the insulation resistance Rn is detected on the basis of the second moving average value VA2.

As the effective voltage range HV of the detection voltage VD used to calculate the moving average value VA becomes larger, the range HS of the detection voltage VD used to calculate the moving average value VA becomes larger, and a larger number of detection voltages VD are used to calculate the moving average value VA. In the present embodiment, the second effective voltage range HV2 used to calculate the second moving average value VA2 is set to be smaller than the first effective voltage range HV1 used to calculate the first moving average value VA1. This makes it possible to reduce the influence of the pulsation of the detection voltage VD by using the first moving average value VA1 and allow the insulation resistance Rn to converge at an early stage by using the second moving average value VA2. As a result, even when an electric leakage occurs, the insulation resistance Rn can be appropriately detected.

Third Embodiment

With regard to a third embodiment, differences from the first embodiment will be mainly described below with reference to FIGS. 6 and 7. The present embodiment differs from the first embodiment in that after the determination that the detection voltage VD is changed by the first predetermined value Vtg1 or more and before the determination that the pulsation of the detection voltage VD is attenuated, the second moving average value VA2 is calculated.

Figure 6:
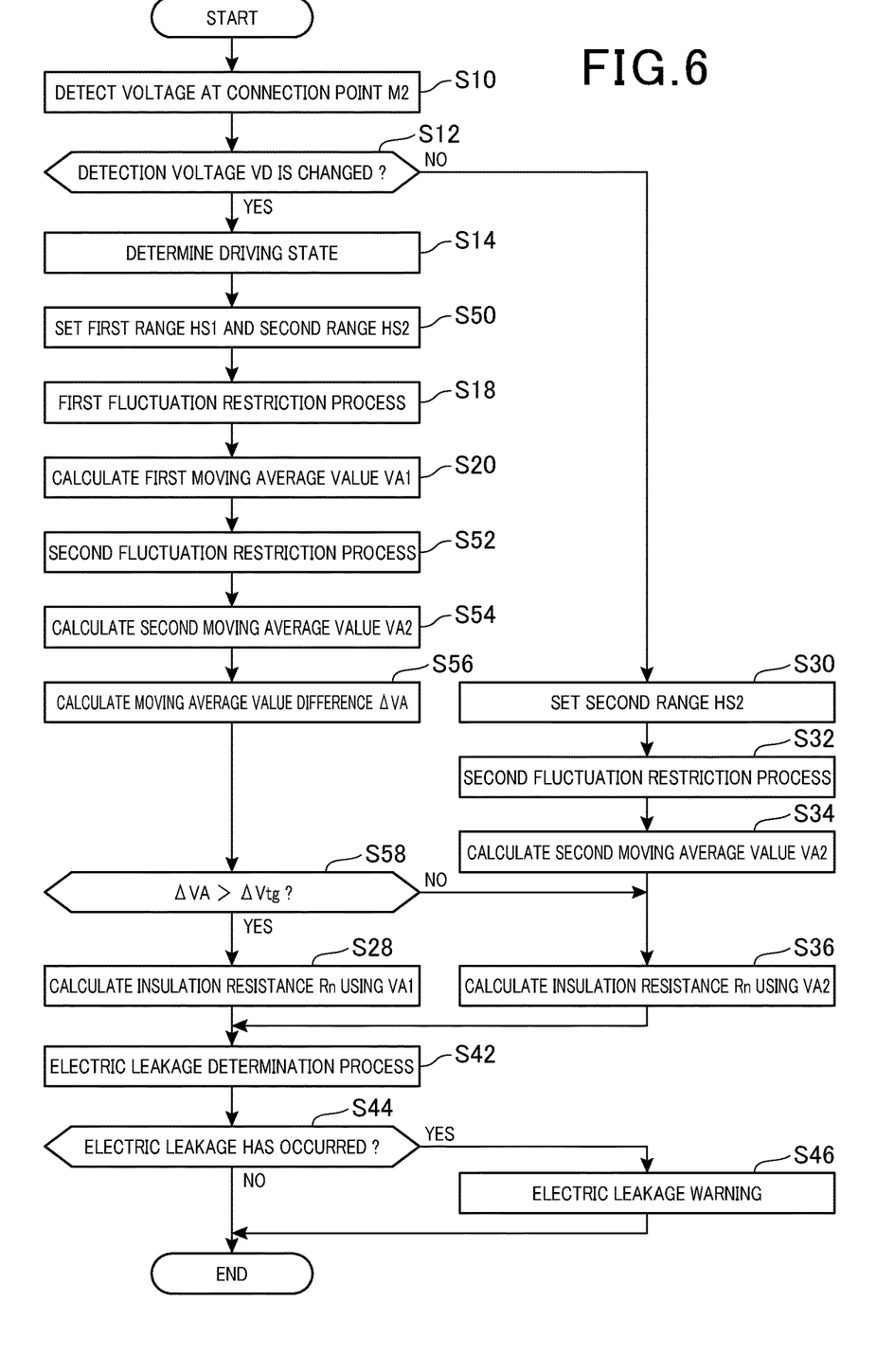
FIG. 6 is a flow chart of the insulation resistance detection process according to a third embodiment.

FIG. 6 shows a flow chart of the insulation resistance detection process of the third embodiment. In FIG. 6, for convenience, the same processes as those in FIG. 2 above are denoted by the same step numbers, and the description thereof is omitted.

As shown in FIG. 6, in the insulation resistance detection process of the present embodiment, after the driving state of the rotary electric machine 10 is determined in step S14, in step S50, the first range HS1 and the second range HS2 are set. Specifically, the first acquisition period HT1 is set on the basis of the driving state of the rotary electric machine 10 determined in step S14, and the first range HS1 used to calculate the first moving average value VA1 is set accordingly. Furthermore, the second acquisition period HT2 for the second range HS2 is set to be shorter than the first acquisition period HT1 for the first range HS1, and the second range HS2 used to calculate the second moving average value VA2 is set accordingly.

After the first moving average value VA1 is calculated in step S20, in steps S52 and S54, the second moving average value VA2 is calculated by using the second range HS2 set in step S50. Thus, in the present embodiment, in response to the determination in step S12 that the detection voltage VD is changed by the first predetermined value Vtg1 or more, the first moving average value VA1 and the second moving average value VA2 are repeatedly calculated in a predetermined cycle. The processes in steps S52 and S54 are the same as those in steps S32 and S34, and redundant description will be omitted.

After the second moving average value VA2 is calculated in steps S52 and S54, it is determined whether the pulsation of the detection voltage VD is attenuated. The present embodiment differs from the first embodiment in the determination condition for determining attenuation of the pulsation of the detection voltage VD.

Specifically, in step S56, a moving average value difference ΔVA is calculated. The moving average value difference ΔVA is a difference between the first moving average value VA1 calculated in step S20 and the second moving average value VA2 calculated in step S54. The moving average value difference ΔVA is expressed by Formula 1.

$$\Delta VA = VA1 - VA2 \quad \text{(Formula 1)}$$

In subsequent step S58, it is determined whether the moving average value difference ΔVA is larger than a reference difference ΔVtg. The reference difference ΔVtg is a voltage difference indicating attenuation of the pulsation of the detection voltage VD. Specifically, in step S58, it is determined whether a state in which the moving average value difference ΔVA is larger than the reference difference ΔVtg continues over a predetermined period TC.

If an affirmative determination is made in step S58, control proceeds to step S28. On the other hand, if a negative determination is made in step S58, control proceeds to step S36.

In the insulation resistance detection process of the present embodiment, in step S30, the second range HS2 is set while the first range HS1 is not set. In this case, for example, the second acquisition period HT2 for the second range HS2 is set to the shortest acquisition period HT among the acquisition periods HT to which the second acquisition period HT2 can be set.

Figure 7:
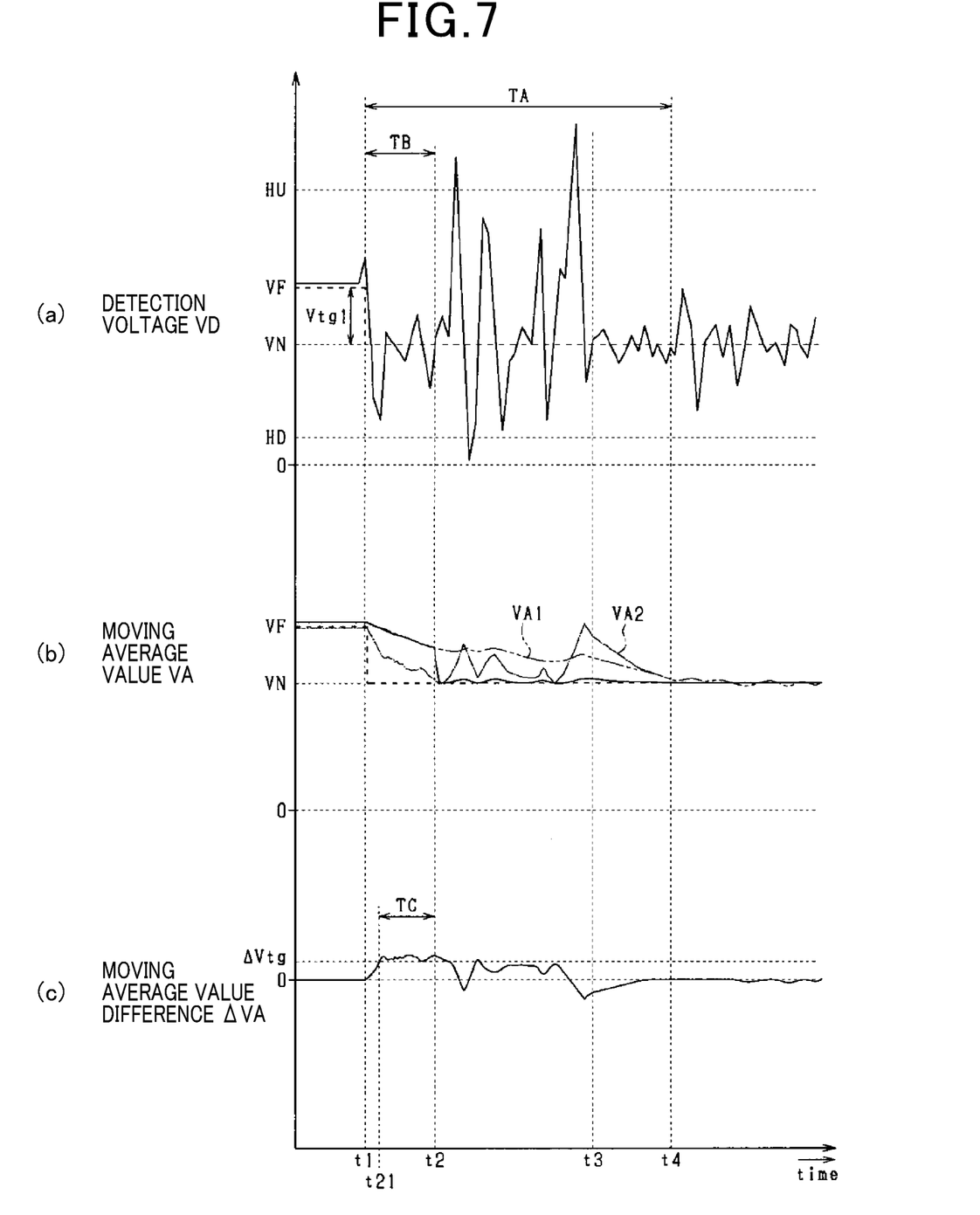
FIG. 7 is a time chart showing transition of the detection voltage and the moving average value according to the third embodiment.

Next, FIG. 7 shows an example of the insulation resistance detection process. FIG. 7 shows transition of the detection voltage VD and the moving average value VA when an electric leakage occurs, and FIG. 7 (c) shows transition of the moving average value difference ΔVA. In FIG. 7, for convenience, the same contents as those in FIG. 3 above are denoted by the same reference numerals, and the description thereof is omitted.

In the present embodiment, in response to a determination at time t1 that the detection voltage VD is changed by the first predetermined value Vtg1 or more, the first moving average value VA1 and the second moving average value VA2 are calculated in a predetermined cycle, and the moving average value difference ΔVA is calculated in a predetermined cycle by using the first moving average value VA1 and the second moving average value VA2. Then, in the case where the state in which the moving average value difference ΔVA is larger than the reference difference ΔVtg continues over the predetermined period TC, it is determined that the pulsation of the detection voltage VD is attenuated.

In the present embodiment described above, by using the first moving average value VA1 and the second moving average value VA2 that are calculated by using the detection voltages VD, it is determined whether the pulsation of the detection voltage VD is attenuated. This makes it possible to appropriately determine attenuation of the pulsation of the detection voltage VD.

In particular, in the present embodiment, by using the moving average value difference ΔVA which is a difference between the first moving average value VA1 and the second moving average value VA2, it is determined whether the pulsation of the detection voltage VD is attenuated. The second moving average value VA2 has better responsiveness than the first moving average value VA1, and is more likely to pulsate due to the pulsation of the detection voltage VD. Thus, in the case where the state in which the moving average value difference ΔVA is larger than the reference difference ΔVtg continues over the predetermined period TC, of the first moving average value VA1 and the second moving average value VA2, the pulsation of the second moving average value VA2, which is more likely to pulsate, is reduced. In this case, the pulsation of the first moving average value VA1 is also naturally reduced. This makes it possible to appropriately determine attenuation of the pulsation of the detection voltage VD by using the moving average value difference ΔVA.

OTHER EMBODIMENTS

The above embodiments may be modified as described below.

The insulation resistance detection device 50 is not necessarily mounted on a hybrid vehicle, and may be mounted on an engine vehicle.

In the above embodiments, the insulation resistance detection device 50 is connected to the negative-electrode-side power supply path L2, but may be connected to the positive-electrode-side power supply path L1.

As a frequency signal, a sinusoidal wave AC signal or a rectangular wave AC signal may be used.

The above embodiments show the example in which during the setting of the range HS of the detection voltage VD, one of the effective voltage range HV and the acquisition period HT is set, but both the effective voltage range HV and the acquisition period HT may be set. In this case, the effective voltage range HV and the acquisition period HT may be set so that the second acquisition period HT2 for the second range HS2 is shorter than the first acquisition period HT1 for the first range HS1 and that the second effective voltage range HV2 for the second range HS2 is smaller than the first effective voltage range HV1 for the first range HS1.

The above embodiments show the example in which the determination condition for determining whether the pulsation of the detection voltage VD is attenuated is a condition that the change amount $\Delta V$ of the first moving average value VA1 is smaller than the second predetermined value Vtg2, but the determination condition is not limited to this.

Figure 8A:
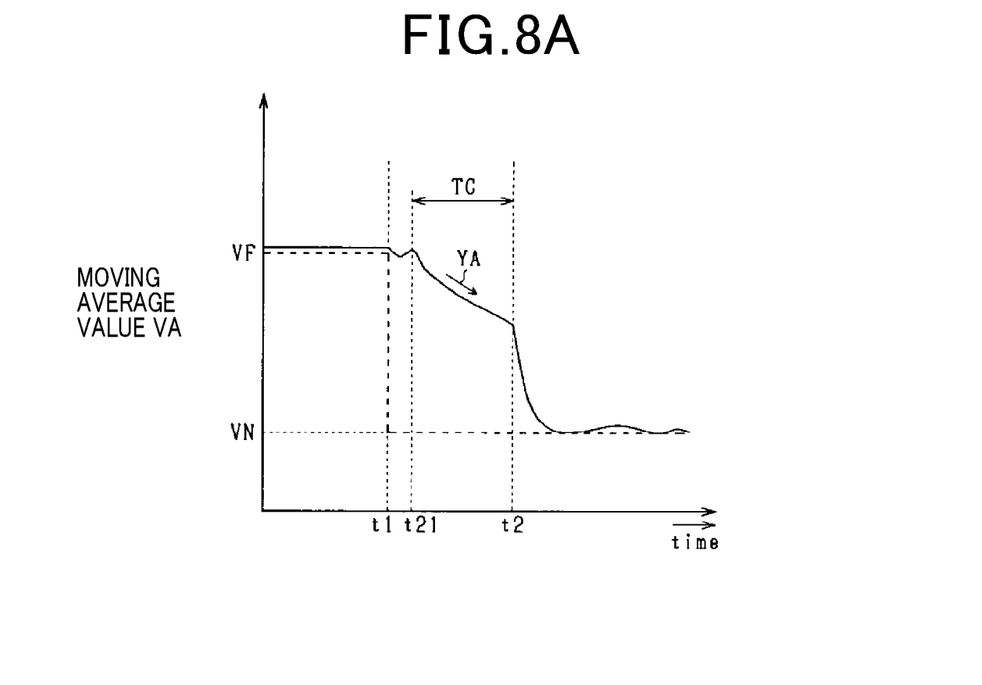
FIG. 8A and FIG. 8B are time charts showing transition of the moving average value according to another embodiment.

For example, as indicated by arrow YA in FIG. 8A, the determination condition may be a condition that the first moving average value VA1 continuously decreases over the predetermined period TC, or may be a condition that the first moving average value VA1 continuously increases over the predetermined period TC. In this case, the first moving average value VA1 continuously increases or decreases, and the increase and the decrease are not alternately repeated; thus, it is possible to determine that the pulsation of the detection voltage VD is attenuated.

Figure 8B:
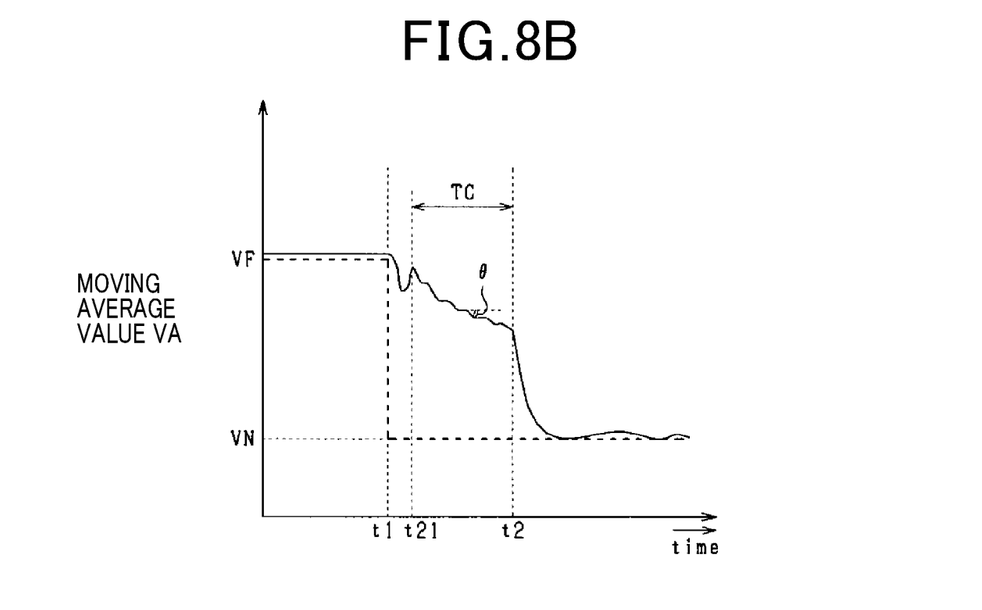

Alternatively, for example, as shown in FIG. 8B, the determination condition may be a condition that an absolute value of a gradient $\theta$ of the first moving average value VA1 is smaller than a threshold over the predetermined period TC. In this case, it is possible to suitably determine, by using the gradient $\theta$ of the first moving average value VA1, that the pulsation of the detection voltage VD is attenuated.

The above embodiments show the example in which the case where the change in the detection voltage VD may occur is the case where an electric leakage occurs, but the case where the change in the detection voltage VD may occur is not limited to this. The change in the detection voltage VD may occur, for example, when an electric leakage occurs and then the electric leakage is eliminated.

The above embodiments show the example in which the first moving average value VA1 and the second moving average value VA2 are calculated, but the number of moving average values VA to be calculated is not limited to two, and may be three or more. In that case, for example, in response to a determination that the detection voltage VD is changed by the first predetermined value Vtg1 or more, the insulation resistance Rn is detected on the basis of the first moving average value VA1 calculated by using the first range HS1. Then, in response to a determination that the pulsation of the detection voltage VD is attenuated, the second moving average value VA2 is calculated by using the second range HS2 that includes a smaller number of detection voltages VD than the first range HS1 does. Furthermore, a third moving average value VA3 is calculated by using a third range HS3 that includes a smaller number of detection voltages VD than the first range HS1 does. Then, the insulation resistance Rn may be detected on the basis of at least one of the second moving average value VA2 and the third moving average value VA3.

In the above embodiments, after a first state in which the insulation resistance Rn is detected on the basis of the first moving average value VA1 is switched to a second state in which the insulation resistance Rn is detected on the basis of the second moving average value VA2, the first moving average value VA1 calculated in the first state and the insulation resistance Rn detected on the basis of the first moving average value VA1 may be converted. Specifically, a process may be further performed in which the first moving average value VA1 and the insulation resistance Rn detected on the basis of the first moving average value VA1 are converted, by using the predetermined conversion information stored in the storage unit 57, into the second moving average value VA2 and the insulation resistance Rn detected on the basis of the second moving average value VA2.

The control unit and the method thereof described in the present disclosure may be implemented by a dedicated computer provided by configuring a processor and memory programmed to perform one or more functions embodied by a computer program. Alternatively, the control unit and the method thereof described in the present disclosure may be implemented by a dedicated computer provided by configuring a processor with one or more dedicated hardware logic circuits. Alternatively, the control unit and the method thereof described in the present disclosure may be implemented by one or more dedicated computers configured by a combination of a processor and memory programmed to perform one or more functions and a processor configured by one or more hardware logic circuits. Furthermore, the computer program may be stored in a non-transitory computer-readable tangible storage medium as instructions executed by a computer.

The present disclosure has been described in accordance with the embodiments, but it is understood that the present disclosure is not limited to the embodiments or structures. The present disclosure encompasses various modifications and variations within an equivalent range. In addition, various combinations and forms, as well as other combinations and forms including only one element, more or less, are within the scope and spirit of the present disclosure.

What is claimed is:

1. An insulation resistance detection device for a power supply system, the power supply system comprising:
   a DC power supply;
   a coupling capacitor, one end of which is connected to a power supply path connected to the DC power supply and insulated from a ground portion;
   a resistance that is connected to the other end of the coupling capacitor; and
   an oscillation unit that is connected to the resistance and outputs a predetermined frequency signal to the resistance, the insulation resistance detection device detecting, in a predetermined cycle, a voltage at a connection point between the coupling capacitor and the resistance in a case where the oscillation unit outputs the frequency signal to the resistance, the insulation resistance detection device detecting an insulation resistance between the ground portion and the power supply path based on a moving average value of a detection voltage, and the insulation resistance detection device comprising a processor programmed to:

determine whether the detection voltage is changed by a predetermined value or more;

in response to a determination that the detection voltage is changed by the predetermined value or more, detect the insulation resistance based on a first moving average value calculated by using the detection voltage in a first range;

after the determination that the detection voltage is changed by the predetermined value or more, determine whether pulsation of the detection voltage is attenuated; and in response to a determination that the pulsation of the detection voltage is attenuated, detect the insulation resistance based on, instead of the first moving average value, a second moving average value calculated by using the detection voltage in a second range including a smaller number of detection voltages than in the first range.

2. The insulation resistance detection device according to claim 1, wherein:

the first range and the second range are defined by using an effective voltage range of the detection voltage;

the processor is programmed to calculate the first moving average value and the second moving average value by using the detection voltage in the effective voltage range; and the effective voltage range used to calculate the second moving average value is smaller than the effective voltage range used to calculate the first moving average value.

3. The insulation resistance detection device according to claim 1, wherein:

the first range and the second range are defined by using an acquisition period of the detection voltage;

the processor is programmed to calculate the first moving average value and the second moving average value by using the detection voltage in the acquisition period; and the acquisition period used to calculate the second moving average value is shorter than the acquisition period used to calculate the first moving average value.

4. The insulation resistance detection device according to claim 1, wherein the power supply system is mounted on an electric vehicle including a motor connected to the DC power supply; and the power supply system is further configured to:
determine a driving state of the motor, and
set the first range based on the driving state of the motor.

5. The insulation resistance detection device according to claim 4, wherein in a case where it is determined that the driving state of the motor is an acceleration state in which a rotation speed of the motor is increased, the power supply system is configured to set the first range to be larger than in a case where it is determined that the driving state of the motor is a deceleration state in which the rotation speed of the motor is reduced.

6. The insulation resistance detection device according to claim 1, wherein the processor is programmed to determine that the pulsation of the detection voltage is attenuated in a case where the first moving average value continuously increases or decreases over a predetermined period.

7. The insulation resistance detection device according to claim 1, wherein the processor is programmed to determine that the pulsation of the detection voltage is attenuated in a case where an absolute value of a gradient of the first moving average value is smaller than a threshold over a predetermined period.

8. The insulation resistance detection device according to claim 1, wherein the processor is programmed to determine whether the pulsation of the detection voltage is attenuated based on whether a power supply amount of the DC power supply is smaller than a predetermined amount.

9. The insulation resistance detection device according to claim 1, wherein the processor is programmed to repeatedly calculate the first moving average value and the second moving average value in the predetermined cycle; and the processor is further programmed to determine that the pulsation of the detection voltage is attenuated in a case where a state in which a difference between the first moving average value and the second moving average value is larger than a reference value continues for a predetermined period.

* * * * *